United States Patent [19]

Barthel et al.

[11] Patent Number: 5,157,590
[45] Date of Patent: Oct. 20, 1992

[54] MOUNTING BRACKET FOR A PROGRAMMABLE LOGIC CONTROLLER CONTROL MODULE

[75] Inventors: Walter E. Barthel, Oconomowoc; John Maggelet, Sussex, both of Wis.

[73] Assignee: Square D Company, Palatine, Ill.

[21] Appl. No.: 688,027

[22] Filed: Apr. 19, 1991

[51] Int. Cl.5 ............................................. H02B 1/01
[52] U.S. Cl. .................................... 361/427; 361/391; 361/394; 361/399
[58] Field of Search .......................... 361/390–395, 361/399, 413, 415, 427; 439/59–62, 638, 639, 650, 651, 135, 136

[56] References Cited

U.S. PATENT DOCUMENTS

| 309,446 | 7/1890 | Russell | D13/12 |
|---|---|---|---|
| 309,600 | 7/1890 | Backes | D13/12 |
| 3,992,654 | 11/1976 | Springer et al. | 361/415 |
| 4,558,914 | 12/1985 | Prager et al. | 439/75 |
| 4,672,509 | 6/1987 | Speraw | 361/391 |
| 4,738,632 | 4/1988 | Schmidt et al. | 361/393 |
| 4,920,453 | 4/1990 | Onose et al. | 361/394 |
| 4,931,909 | 6/1990 | Backes | 361/399 |
| 4,956,750 | 9/1990 | Maggelet | 361/415 |
| 4,985,803 | 1/1991 | Pum et al. | 361/391 |
| 5,032,951 | 7/1991 | Scheopp et al. | 361/391 |
| 5,043,847 | 8/1991 | Deinhardt et al. | 361/395 |
| 5,065,141 | 11/1991 | Whitsitt | 361/415 |
| 5,099,391 | 3/1992 | Maggelet et al. | 361/395 |

FOREIGN PATENT DOCUMENTS

| 0067757 | 12/1982 | European Pat. Off. | 361/392 |
|---|---|---|---|
| 0419689 | 4/1991 | European Pat. Off. | 361/415 |
| 0419691 | 4/1991 | European Pat. Off. | 361/415 |
| 0087596 | 3/1990 | Japan | 361/415 |

Primary Examiner—Leo P. Picard
Assistant Examiner—D. Sparks
Attorney, Agent, or Firm—Michael J. Femal; Richard J. Graefe

[57] ABSTRACT

A mounting bracket is used for holding a housing enclosing a control module assembly of the type used in programmable logic controllers. The bracket has a base or back side, a right side wall, a lower segment and an upper segment that cooperate to define a mounting bracket for a single control module. The base has mounting slots for attaching the mounting bracket to a panel. The side wall has clearance holes for attaching the mounting bracket to the side of a PLC rack assembly instead if desired. The lower segment contains a threaded insert that aligns with and accepts a mounting screw on the control module and the upper segment mates with a slotted opening on the control module. The control module is fastened to the mounting bracket by one mounting screw. This provides a quick and efficient method of attaching or removing the control module.

4 Claims, 4 Drawing Sheets

MOUNTING BRACKET FOR A PROGRAMMABLE LOGIC CONTROLLER CONTROL MODULE

TECHNICAL FIELD

Applicants' invention relates generally to electrical control mechanisms and more particularly to a mounting bracket adaptable for use with a power supply module contained in a circuit board housing that supplies control voltages for a programmable logic controller that performs a number of control functions.

RELATED APPLICATION

This application is related to commonly assigned pending application to Maggelet et. al., Ser. No. 07/635,050 entitled "Housing For A Rack Mountable Power Supply For Use With A Programmable Logic Controller", the specifications of which are expressly incorporated herein.

BACKGROUND ART

Circuit board module assemblies supporting a plurality of interconnected electric components to provide a variety of control functions are well known. The circuit boards of the control module are made of a non-metallic material and are normally mounted in a sturdy housing. In most instances, these control module assemblies are electrically interconnected in a rack assembly to form a programmable logic controller (PLC) that is normally used to control a number of functions in a manufacturing operation. This programmable logic controller is often of necessity located on the plant floor and thus is subject to considerable abuse.

Power supply modules are available that can be mounted directly in the rack assembly. It sometimes becomes necessary to add an additional control module to a fully populated rack assembly. This could require adding a completely new, full-sized rack assembly. Or alternatively, a separate panel mounted power supply that would be more costly. These assemblies are generally bulky and require mounting space that may not be available.

It is also well known that the control modules require frequent replacement when a malfunction occurs. Since a malfunction of necessity shuts down the machine operation, replacement must be made in a minimum amount of time.

The present invention provides a mounting bracket which easily accommodates a single control module and also provides a simple fastening means to allow for quick replacement of a malfunctioning module.

SUMMARY OF THE INVENTION

According to the present invention, the bracket has a base or back side, a right side wall, a lower segment and an upper segment that cooperate to define a mounting means for a single control module of the type used in programmable logic controllers (PLCs). The base has two mounting slots for attaching the mounting bracket to a panel. The side wall has clearance holes for attaching the mounting bracket to the side of a PLC rack assembly instead if desired. The lower segment contains a press-fit, threaded insert that aligns with and accepts a mounting screw on the control module and the upper segment mates with a slotted opening on the control module. The control module is fastened to the mounting bracket by the mounting screw. This provides a quick and efficient method of attaching or removing a control module in a PLC system when a malfunction occurs. Wiring to the module from the rack assembly is terminated at plugs or terminal blocks on the module.

DETAILED DESCRIPTION

Although this invention is susceptible to embodiments of many different forms, a preferred embodiment will be described and illustrated in detail herein. The present disclosure exemplifies the principles of the invention and is not to be considered a limit to the broader aspects of the invention to the particular embodiment as described.

Figure 1:
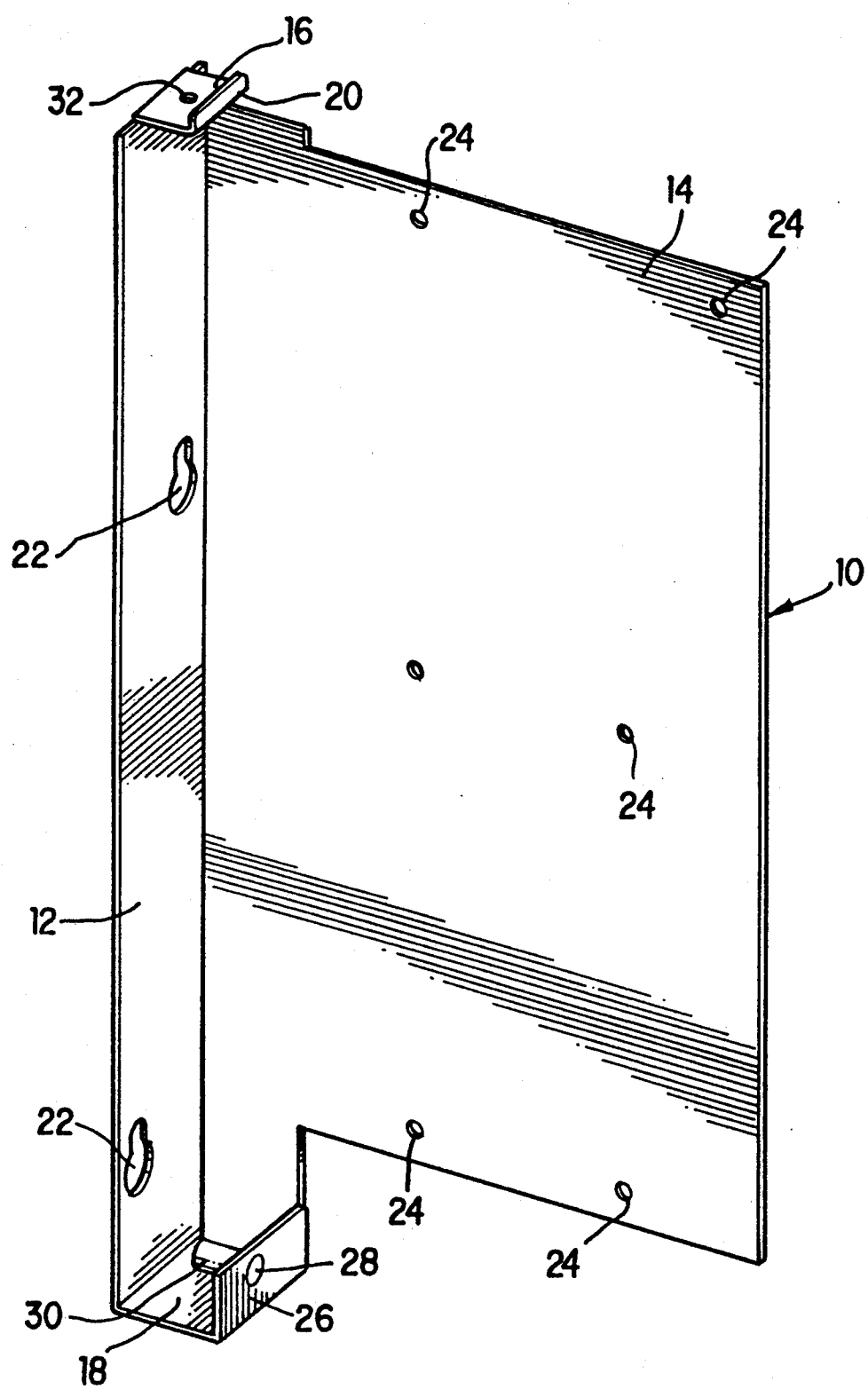
FIG. 1 is a perspective view of the mounting bracket constructed in accordance with the teachings of the present invention.

Referring to FIG. 1 of the drawings, a mounting bracket 10 is disclosed. The bracket 10 is formed from one continuous piece of metal. The bracket 10 has a base 12, a right side wall 14, an upper segment 16, and a lower segment 18. The side wall 14 is perpendicular to the base 12. The upper segment 16 also extends perpendicular to the top of base 12 and has a further tab 20 extending upward. L-shaped lower segment 18 is formed at a right angle to the bottom of the base 12. The mounting bracket 10 can be secured either to a panel, not shown, or to the side of a PLC rack assembly of the type disclosed in commonly assigned U.S. Pat. No. 4,956,750 granted to Maggelet et al., entitled "A Register Rack Assembly for a Programmable Controller System" also not shown. Two keyhole style openings 22 located on opposite ends of base 12 provide clearance for mounting screws to attach the bracket 10 to a panel. Six spaced holes 24 in right side wall 14 align with mounting holes on the side of the above mentioned PLC rack assembly and allow clearance for fasteners to secure the mounting bracket 10 to the rack assembly. The lower segment 18 has an upper extension 26 with an opening 28 through which a threaded insert 30 is pressfit. Upper segment 16 has a further hole 32 for receiving an optional fastener, the details of which will be described below.

Figure 2:
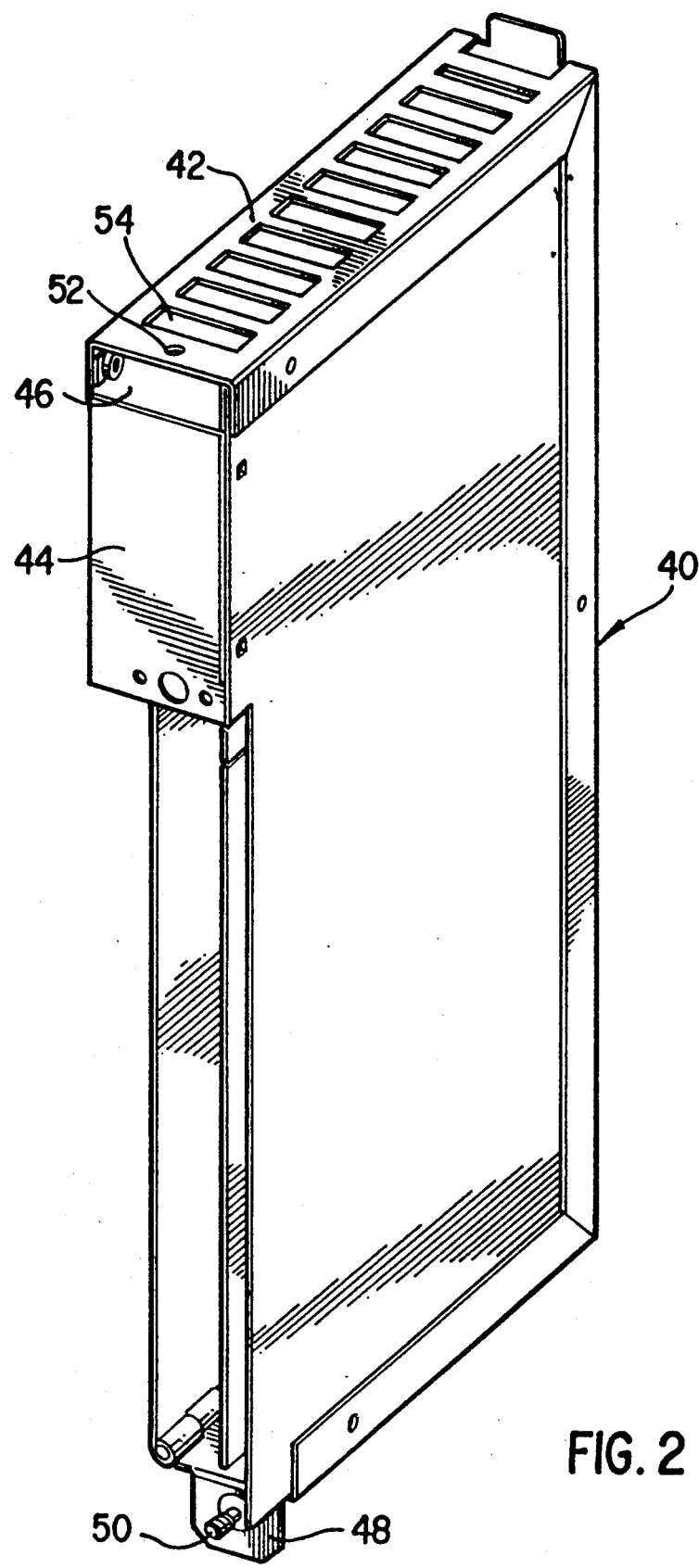
FIG. 2 is a perspective rear view of a typical control module illustrating the fastening means of the control module.

A typical control module 40 is shown in FIG. 2. The upper portion 42 of module 40 combines with a backplate 44 to form an opening 46 at the rear of the module 40. A tab 48 at the rear lower end of the module 40 contains a threaded, captive fastener 50. A hole 52 is located on the upper portion 42.

Figure 3:
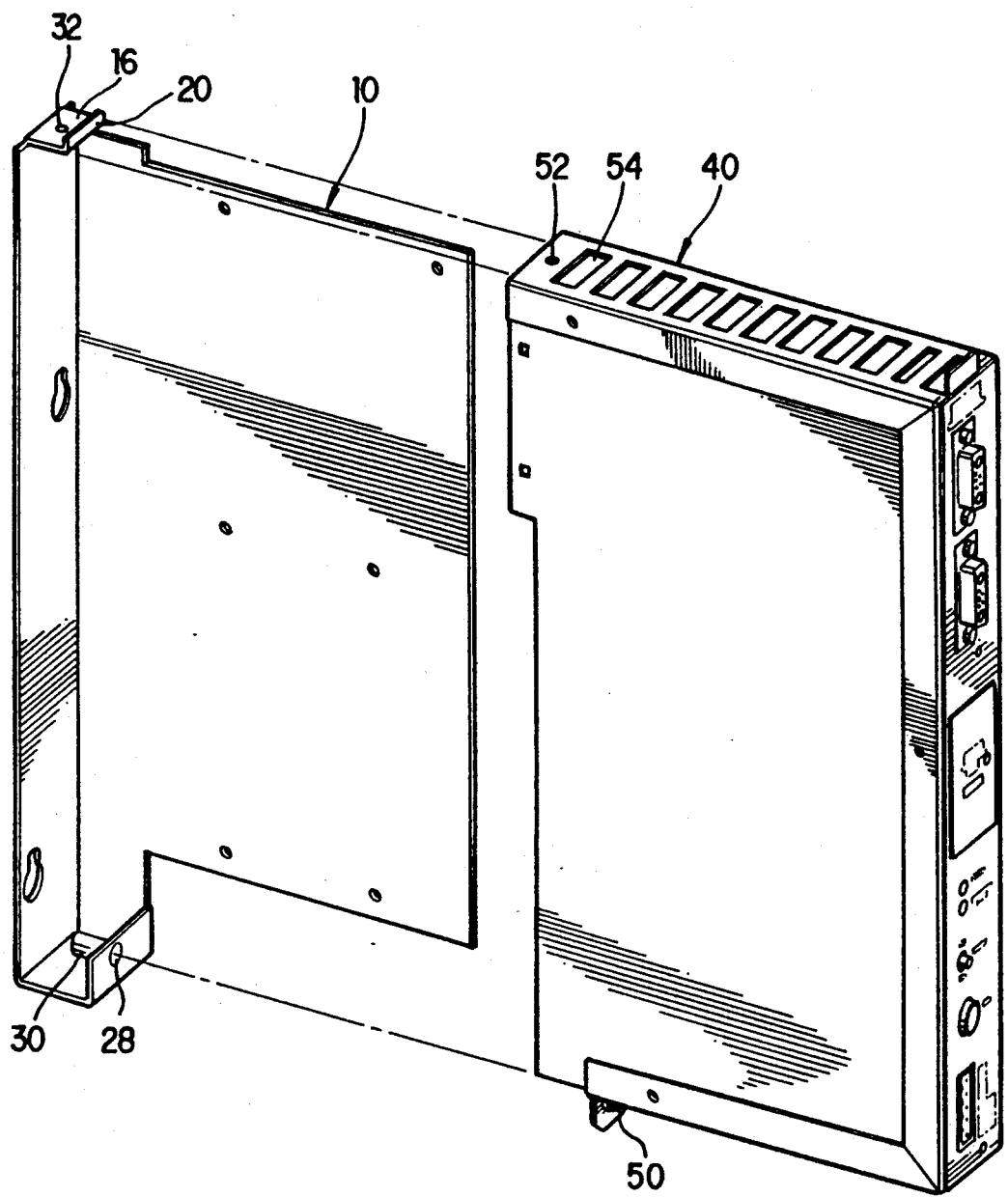
FIG. 3 is a perspective view detailing the fastening means of the control module to the mounting bracket.

The top of module 40 also contains slots 54 as illustrated in FIG. 3. The control module 40 is fastened to the mounting bracket 10 in the following manner. Tab 16 passes through the formed opening 46 of the control module 40. Tab 16 is dimensioned such that the upper extension 20 fits securely against the rear edge of the first slot 54 of the module 40 when the module 40 is fully inserted into the mounting bracket 10. Fastener 50 is screwed into the the threaded insert 30 of the mounting bracket 10.

Figure 4:
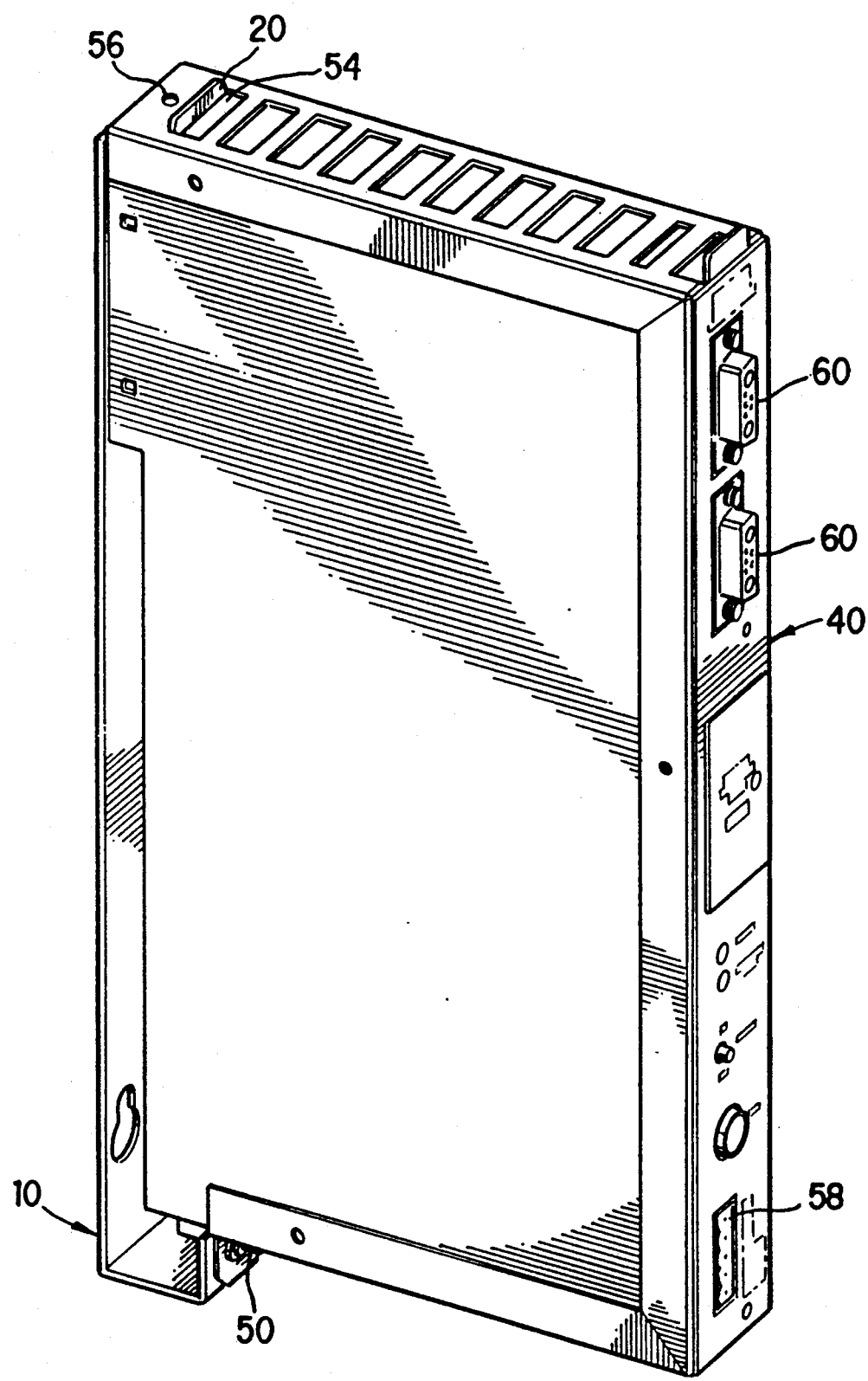
FIG. 4 is a perspective view illustrating a control module fastened to the mounting bracket.

According to one aspect of the invention, the mounting bracket 10 and control module 40 is configured such that the control module 40 is a power supply as shown in FIG. 4. The extension 20 secures the top of the module 40 and the fastener 50 secures the bottom portion of the module 40 to the bracket 10. Because of the additional weight of the components that may be present in a power supply module, additional fastening means is provided by a self-threading fastener 56 through hole 52 on the top of the module 40 and hole 32 on the mounting bracket 10. Incoming power is supplied through a terminal block 58 on the front of the module and output power is supplied to other modules in the programmable logic controller through the plug connectors 60.

While the specific embodiments have been illustrated and described, numerous modifications are possible without departing from the scope or spirit of the invention.

We claim:

1. A mounting bracket for a programmable logic controller control module, the bracket comprising:
   (a) a base;
   (b) a side wall extending perpendicular from the right side edge of the base;
   (c) an upper segment extending out from the top edge of the base;
   (d) a lower segment extending out from the bottom edge of the base;
   (e) a tab extending upward and perpendicular from said upper segment;
   (f) a threaded insert in said lower segment;
   (g) means for securing said bracket to a panel, said means provided by a plurality of slotted mounting holes located in said base; and
   (h) wherein a control module is secured to said mounting bracket cooperatively by said tab and said insert, said tab hooking and engaging an upper rear corner of said control module and said insert accepting a threaded fastener located on a lower portion of said control module.

2. The mounting bracket as defined in claim 1 wherein mounting means are provided by a plurality of mounting holes located in said side wall, said mounting means allowing for attaching said bracket to the side of a programmable logic controller rack assembly.

3. The mounting bracket as defined in claim 1 wherein said bracket is formed from one continuous piece of metal.

4. The mounting bracket as defined in claim 1 wherein said control module is a power supply module.

* * * * *